US012777738B2

(12) United States Patent
Nakajima et al.

(10) Patent No.: US 12,777,738 B2
(45) Date of Patent: Oct. 27, 2026

(54) PHOTODETECTION ELEMENT AND METHOD FOR MANUFACTURING PHOTODETECTION ELEMENT

(71) Applicant: HAMAMATSU PHOTONICS K.K., Hamamatsu (JP)

(72) Inventors: Kazutoshi Nakajima, Hamamatsu (JP); Hiroyasu Fujiwara, Hamamatsu (JP); Wei Dong, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 398 days.

(21) Appl. No.: 18/371,606

(22) Filed: Sep. 22, 2023

(65) Prior Publication Data

US 2024/0105870 A1 Mar. 28, 2024

(30) Foreign Application Priority Data

Sep. 26, 2022 (JP) ................................ 2022-152473

(51) Int. Cl.

| | |
|---|---|
| ***H01L 31/0368*** | (2006.01) |
| ***H10F 30/222*** | (2025.01) |
| ***H10F 71/00*** | (2025.01) |
| ***H10F 77/164*** | (2025.01) |
| ***H10F 77/20*** | (2025.01) |

(52) U.S. Cl.
CPC ....... *H10F 77/1642* (2025.01); *H10F 30/222* (2025.01); *H10F 71/1215* (2025.01); *H10F 77/241* (2025.01)

(58) Field of Classification Search
CPC ............... H10F 77/1642; H10F 30/222; H10F 71/1215; H10F 77/241; H10F 71/1212; H10F 71/128; H10F 71/131
See application file for complete search history.

(56) References Cited

U.S. PATENT DOCUMENTS 4,357,183 A * 11/1982 Fan .................... H10P 14/3411 117/936
4,529,455 A * 7/1985 Bean .................... H10D 62/822 117/936

(Continued)

FOREIGN PATENT DOCUMENTS

JP 05-090172 A 4/1993
JP 2010-533989 A 10/2010

(Continued)

OTHER PUBLICATIONS

Masini et al., "Advances in the field of poly-Ge on Si near infrared photodetectors", Materials Science and Engineering: B, vol. 69-70, No. 1, Jan. 2000, pp. 257-260.

(Continued)

*Primary Examiner* — Jarrett J Stark
(74) *Attorney, Agent, or Firm* — Faegre Drinker Biddle & Reath LLP

(57) ABSTRACT

A photodetection element includes an N-type silicon layer formed in a single crystal state, a P-type germanium-containing layer formed in a polycrystal state and forming a hetero PN junction between the germanium-containing layer and the silicon layer, a first electrode electrically connected to the silicon layer, and a second electrode electrically connected to the germanium-containing layer.

4 Claims, 9 Drawing Sheets

(56) References Cited

U.S. PATENT DOCUMENTS

| | | | | |
|---|---|---|---|---|
| 4,861,393 | A * | 8/1989 | Bean | H10D 62/822<br>148/DIG. 59 |
| 5,324,364 | A * | 6/1994 | Matsuda | H10F 10/13<br>136/258 |
| 5,561,306 | A * | 10/1996 | Imamura | H10D 62/136<br>257/197 |
| 6,743,974 | B2 * | 6/2004 | Wada | H10F 10/19<br>136/249 |
| 10,700,225 | B2 * | 6/2020 | Wang | G02B 1/002 |
| 2004/0121507 | A1 * | 6/2004 | Bude | H10P 14/2905<br>257/431 |
| 2005/0001238 | A1 * | 1/2005 | Oue | H10D 10/054<br>257/E29.184 |
| 2006/0022226 | A1 * | 2/2006 | Wada | H10F 30/245<br>257/233 |
| 2006/0260676 | A1 * | 11/2006 | Gao | H10F 77/148<br>257/E31.039 |
| 2009/0061557 | A1 * | 3/2009 | Akiyama | H10P 90/1916<br>438/94 |
| 2011/0227116 | A1 * | 9/2011 | Saito | H01S 5/125<br>257/E31.011 |
| 2013/0034950 | A1 * | 2/2013 | Lin | H10F 10/16<br>257/E21.129 |
| 2013/0095598 | A1 * | 4/2013 | Bedell | H10F 10/144<br>257/E31.127 |
| 2015/0017788 | A1 * | 1/2015 | Vu | H10P 14/3456<br>438/488 |
| 2015/0259825 | A1 * | 9/2015 | Wang | C23C 14/14<br>428/221 |
| 2015/0303345 | A1 | 10/2015 | Gity et al. | |
| 2022/0229228 | A1 * | 7/2022 | Coolbaugh | G02B 6/12004 |

FOREIGN PATENT DOCUMENTS

| | | | |
|---|---|---|---|
| JP | 2021-022619 | A | 2/2021 |
| WO | 2009/013242 | A1 | 1/2009 |

OTHER PUBLICATIONS

Sorianello et al., "Low-temperature germanium thin films on silicon", Optical Materials Express, vol. 1, No. 5, 2011, pp. 856-865.

* cited by examiner

PHOTODETECTION ELEMENT AND METHOD FOR MANUFACTURING PHOTODETECTION ELEMENT

TECHNICAL FIELD

The present disclosure relates to a photodetection element and a method for manufacturing a photodetection element.

BACKGROUND

Regarding photodetection elements sensitive to light of a short-wave infrared region, intensive research has been carried out on photodetection elements based on a silicon substrate in place of a high-cost compound semiconductor substrate. Such a photodetection element can serve as an effective device in various types of analysis in the field of biotechnology, a technology of controlling autonomous driving, and the like. For example, Japanese Unexamined Patent Publication No. 2021-022619 discloses a light receiving element including a silicon substrate, an insulating layer formed on the silicon substrate, and a single-crystal germanium crystal forming a heterojunction region with respect to the silicon substrate inside an opening portion formed in the insulating layer.

SUMMARY

Generally, in order to improve the performance of a light receiving element, research focused on how a single-crystal germanium region can be formed on a single-crystal silicon substrate with high quality is in progress. However, it is difficult to form a single-crystal germanium region over a large area on a single-crystal silicon substrate (that is, increase an area of a light receiving region), and as in the light receiving element disclosed in Japanese Unexamined Patent Publication No. 2021-022619, the research has gone no further than forming a single-crystal germanium crystal inside an opening portion formed in an insulating layer.

An object of the present disclosure is to provide a photodetection element in which an area of a light receiving region can be increased while a hetero PN junction is utilized, and a method for manufacturing a photodetection element.

A photodetection element according to an aspect of the present disclosure is "a photodetection element including an N-type silicon layer formed in a single crystal state, a P-type germanium-containing layer formed in a polycrystal state and forming a hetero PN junction between the germanium-containing layer and the silicon layer, a first electrode electrically connected to the silicon layer, and a second electrode electrically connected to the germanium-containing layer".

DETAILED DESCRIPTION

Hereinafter, embodiments of the present disclosure will be described in detail with reference to the drawings. In each diagram, the same reference signs are applied to parts which are the same or corresponding, and duplicate description thereof will be omitted.

First Embodiment

Figure 1:
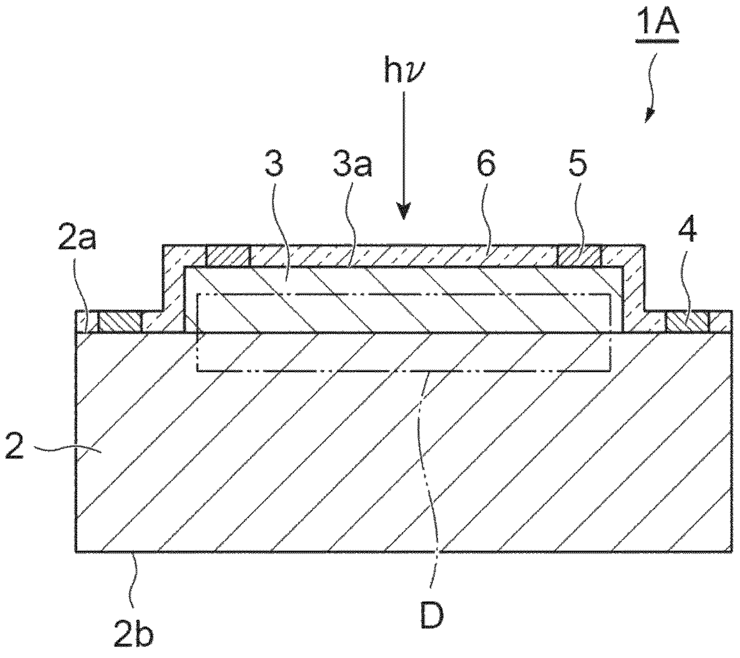
FIG. 1 is a cross-sectional view of a photodetection element of a first embodiment.
Figure 2:
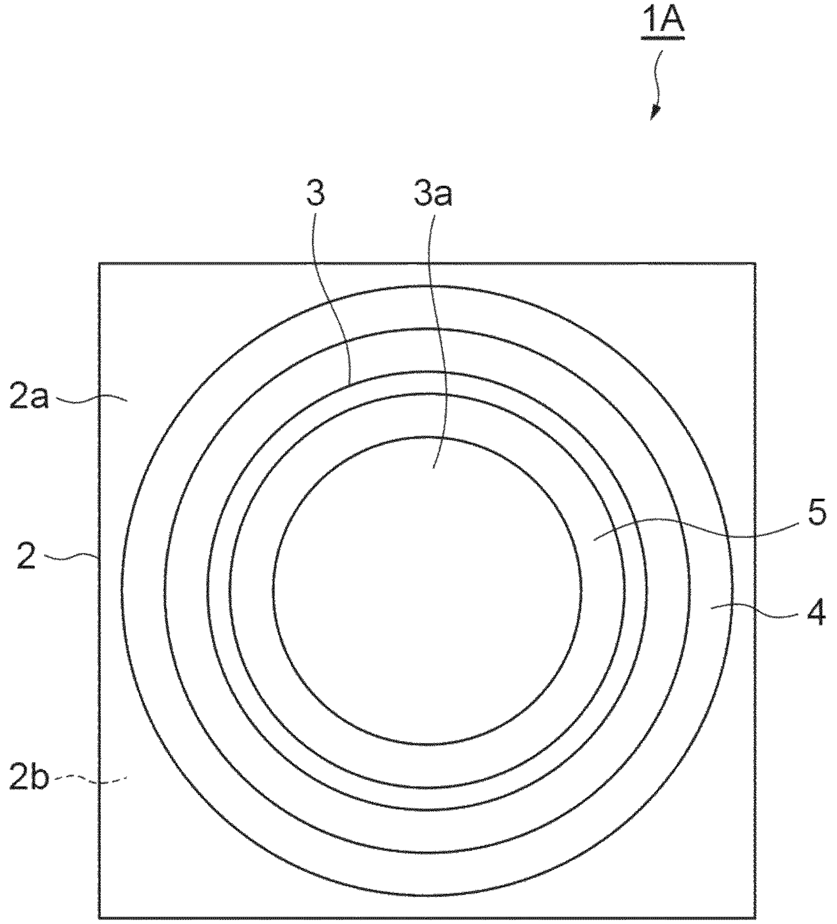
FIG. 2 is a plan view of the photodetection element illustrated in FIG. 1.

FIG. 1 is a cross-sectional view of a photodetection element 1A of a first embodiment, and FIG. 2 is a plan view of the photodetection element 1A illustrated in FIG. 1. As illustrated in FIGS. 1 and 2, the photodetection element 1A includes a silicon layer 2, a germanium-containing layer 3, a first electrode 4, a second electrode 5, and an antireflection film 6. In FIG. 2, illustration of the antireflection film 6 is omitted.

The silicon layer 2 is an N-type silicon layer formed in a single crystal state. The silicon layer 2 has a first surface 2*a*, and a second surface 2*b* on a side opposite to the first surface 2*a*. As an example, the silicon layer 2 is a single-crystal silicon substrate having a rectangular plate shape. A thickness of the silicon layer 2 is approximately several hundred μm, for example, and a length of one side of the silicon layer 2 when viewed in a thickness direction of the silicon layer 2 is approximately several mm, for example.

The germanium-containing layer 3 is a P-type germanium-containing layer formed in a polycrystal state and forming a hetero PN junction between the germanium-containing layer 3 and the silicon layer 2. The germanium-containing layer 3 is disposed on the first surface 2*a* of the silicon layer 2. A depletion layer D is formed in a boundary region between the silicon layer 2 and the germanium-containing layer 3. A carrier concentration of the silicon layer 2 (a concentration of N-type impurities) is adjusted such that the depletion layer D is formed on the germanium-containing layer 3 side in preference to the silicon layer 2 side (that is, such that the thickness of a region formed on the germanium-containing layer 3 side in the depletion layer D is larger than the thickness of a region in the depletion layer D formed on the silicon layer 2 side).

When viewed in the thickness direction of the silicon layer 2 (that is, a direction perpendicular to the first surface 2*a*), an outer edge of the germanium-containing layer 3 is positioned on an inward side of an outer edge of the silicon layer 2. In other words, when viewed in the thickness direction of the silicon layer 2, the germanium-containing layer 3 is surrounded by a region of the first surface 2*a* where the germanium-containing layer 3 is not disposed. The germanium-containing layer 3 is formed to have a circular film shape, for example. A diameter of the germanium-containing layer 3 when viewed in the thickness direction of the silicon layer 2 is approximately several μm to several mm, for example.

The germanium-containing layer 3 is "a layer formed of germanium", "a layer formed of a mixed crystal of germanium and tin", or "a layer formed of a mixed crystal of germanium and silicon". Namely, the germanium-containing layer 3 is "a layer formed of germanium alone" or "a layer of a mixed crystal having germanium as a main component and including tin or silicon of Group IV in the periodic table". The carrier concentration of the germanium-containing layer 3 is optimized by film formation conditions or the like such that the depletion layer D extends inside the germanium-containing layer 3. The thickness of the germanium-containing layer 3 is 1 μm to 2 μm. Since an energy bandgap becomes narrower when the germanium-containing layer 3 is "a layer formed of a mixed crystal of germanium and tin" than when the germanium-containing layer 3 is "a layer formed of germanium", a light sensitivity on a longer wavelength side can be enhanced.

The first electrode 4 is electrically connected to the silicon layer 2. The first electrode 4 is disposed on a region of the first surface 2*a* of the silicon layer 2 where the germanium-containing layer 3 is not disposed. When viewed in the thickness direction of the silicon layer 2, the first electrode 4 extends along the outer edge of the germanium-containing layer 3 on an outward side of the outer edge of the germanium-containing layer 3. The first electrode 4 extends in a ring shape, for example. The first electrode 4 is formed using titanium or a laminate of titanium and gold, for example.

The second electrode 5 is electrically connected to the germanium-containing layer 3. The second electrode 5 is disposed on a surface 3*a* of the germanium-containing layer 3 on a side opposite to the silicon layer 2. When viewed in the thickness direction of the silicon layer 2, the second electrode 5 extends along the outer edge of the germanium-containing layer 3 on the inward side of the outer edge of the germanium-containing layer 3. The second electrode 5 extends in a ring shape, for example. The second electrode 5 is formed using gold, platinum, or a laminate of platinum and gold, for example.

The antireflection film 6 is formed on a region of the surface 3*a* of the germanium-containing layer 3 on the inward side of the second electrode 5. In the present embodiment, the antireflection film 6 is also formed on the region of the surface 3*a* of the germanium-containing layer 3 on an outward side of the second electrode 5, a side surface of the germanium-containing layer 3, a region of on the first surface 2*a* of the silicon layer 2 between the germanium-containing layer 3 and the first electrode 4, and a region of the first surface 2*a* of the silicon layer 2 on an outward side of the first electrode 4, and the antireflection film 6 formed in these regions functions as a protective film. The antireflection film 6 is formed of silicon oxide or silicon nitride, for example.

In the photodetection element 1A constituted as described above, when light hv (detection target) is incident on the germanium-containing layer 3 through the antireflection film 6 formed on the surface 3*a* of the germanium-containing layer 3, the light hv is absorbed in the germanium-containing layer 3, and photoelectric conversion occurs in the germanium-containing layer 3. Carriers generated due to this are drawn out from the depletion layer D as current signals through the first electrode 4 and the second electrode 5. The light hv (detection target) is light of a short-wave infrared region.

Next, a method for manufacturing the photodetection element 1A will be described. FIGS. 3A to 4B are views illustrating the method for manufacturing the photodetection element 1A illustrated in FIG. 1. FIGS. 3A to 4B illustrate a part corresponding to one photodetection element 1A. However, actually, each step is performed at a level of a wafer including a plurality of parts corresponding to a plurality of photodetection elements 1A, and a plurality of photodetection elements 1A are finally obtained by dicing a wafer.

Figure 3A:
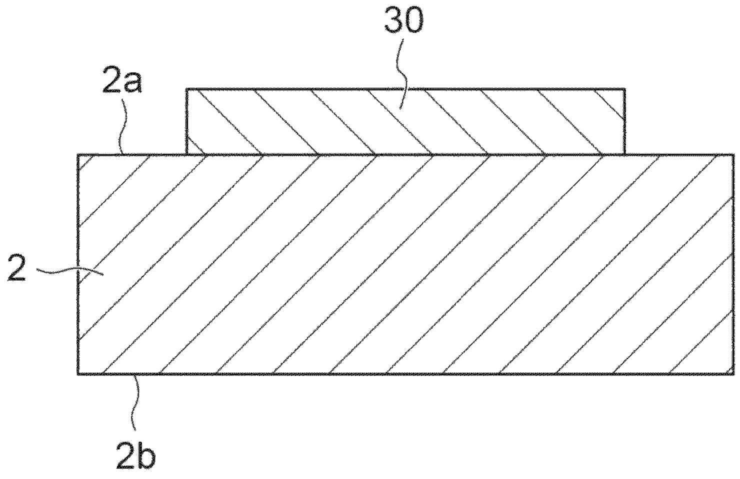
FIGS. 3A, 3B, and 3C are a view illustrating a method for manufacturing the photodetection element illustrated in FIG. 1.

First, as illustrated in FIG. 3A, a layer 30 including germanium is subjected to film formation on the silicon layer 2 (first step). As an example, the first step is performed inside a film formation device (for example, an RF sputtering device) heated to a temperature of 100° C. to 150° C. (for example, 125° C.).

Figure 3B:
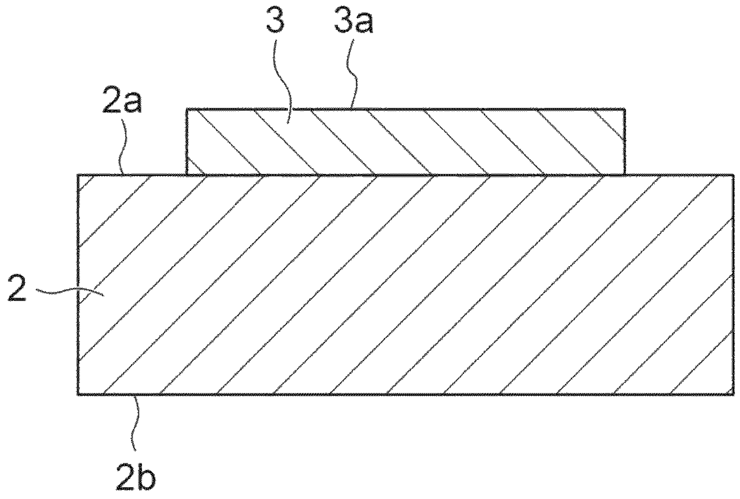

Subsequently, as illustrated in FIG. 3B, when the layer 30 including germanium is heated, the layer 30 including germanium is polycrystallized, and the germanium-containing layer 3 is formed (second step). As an example, the second step is performed inside a heat treatment device (for example, an electric furnace) filled with inert gas (for example, nitrogen). In the second step, it is preferable that the layer 30 including germanium be heated at a temperature of 500° C. or higher, and it is more preferable that the layer 30 including germanium be heated at a temperature of 700° C. or higher. In the second step, it is preferable that the layer 30 including germanium be heated for one hour or longer.

Figure 3C:
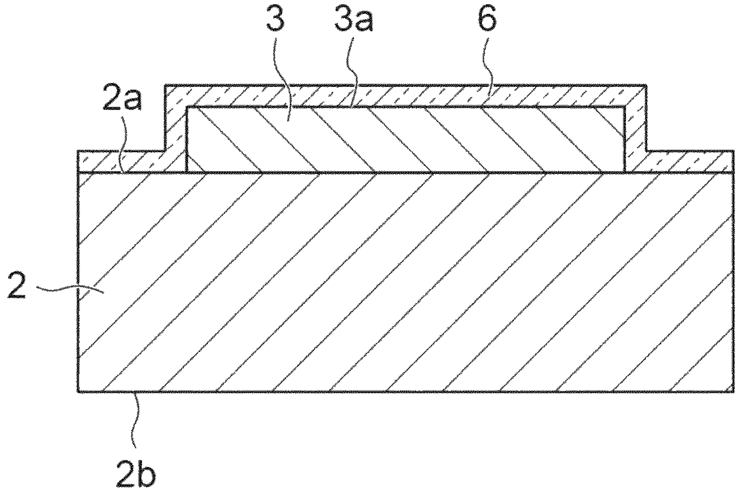
Figure 4A:
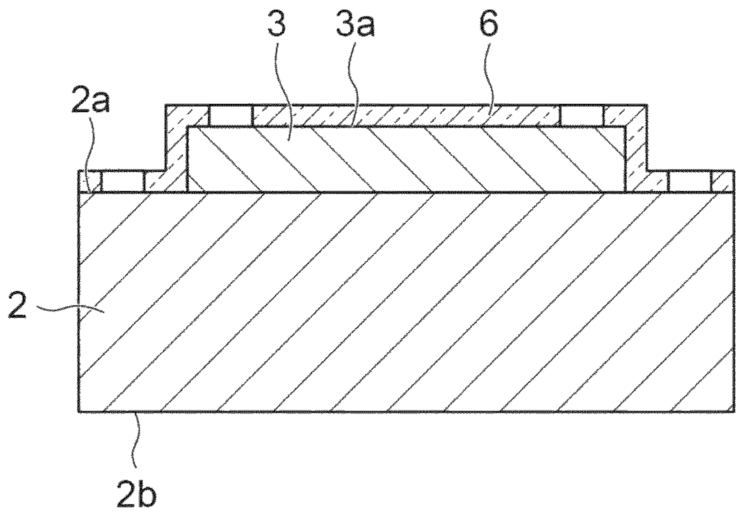
FIGS. 4A, and 4B are another view illustrating the method for manufacturing the photodetection element illustrated in FIG. 1.
Figure 4B:
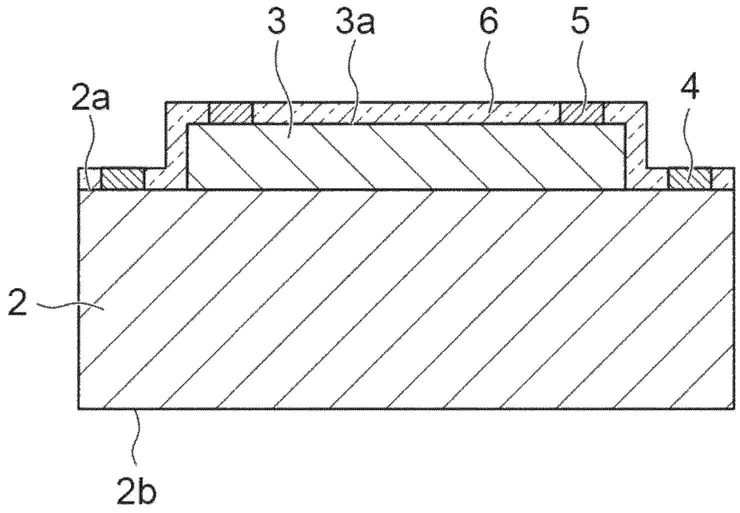

Subsequently, as illustrated in FIG. 3C, the antireflection film 6 is formed on the surface 3*a* of the germanium-containing layer 3, the side surface of the germanium-containing layer 3, and a region of the first surface 2*a* of the silicon layer 2 where the germanium-containing layer 3 is not disposed. Subsequently, as illustrated in FIG. 4A, the antireflection film 6 is patterned, and as illustrated in FIG. 4B, the first electrode 4 and the second electrode 5 are formed in the region where the antireflection film 6 is removed.

FIGS. 5A to 6B are views showing evaluation results of crystallinity by X-ray diffraction (specifically, 2θ-ω scanning results). An evaluation target in FIG. 5A was obtained by forming a film of germanium on a silicon wafer of normal specification under predetermined conditions and performing heating "at 400° C. for five hours" inside an electric furnace filled with nitrogen. An evaluation target in FIG. 5B was obtained by forming a film of germanium on a silicon wafer of normal specification under predetermined conditions and performing heating "at 500° C. for five hours" inside an electric furnace filled with nitrogen. An evaluation target in FIG. 6A was obtained by forming a film of germanium on a silicon wafer of normal specification under predetermined conditions and performing heating "at 600° C. for five hours" inside an electric furnace filled with nitrogen. An evaluation target in FIG. 6B was obtained by forming a film of germanium on a silicon wafer of normal specification under predetermined conditions and performing heating "at 700° C. for five hours" inside an electric furnace filled with nitrogen.

Figure 5A:
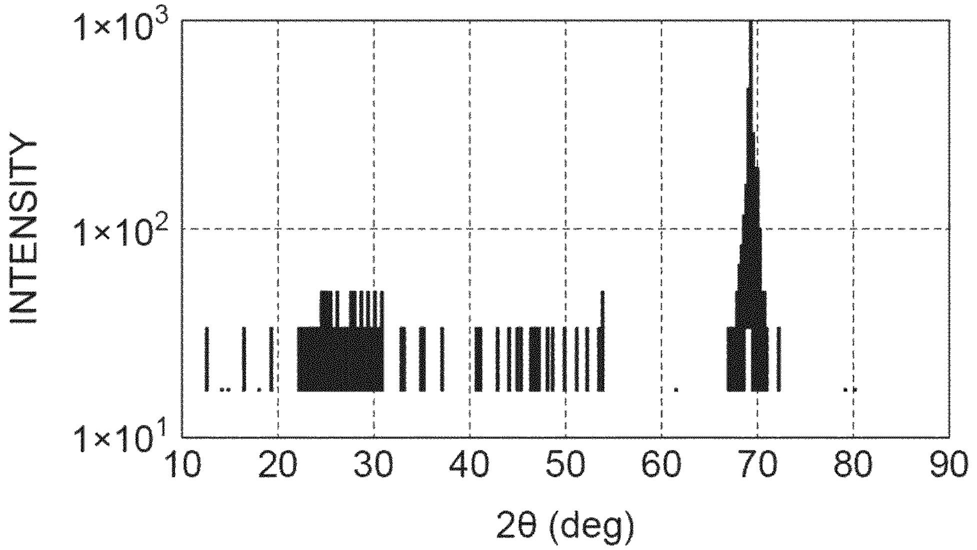
FIGS. 5A, and 5B are a view showing evaluation results of crystallinity by X-ray diffraction.
Figure 5B:
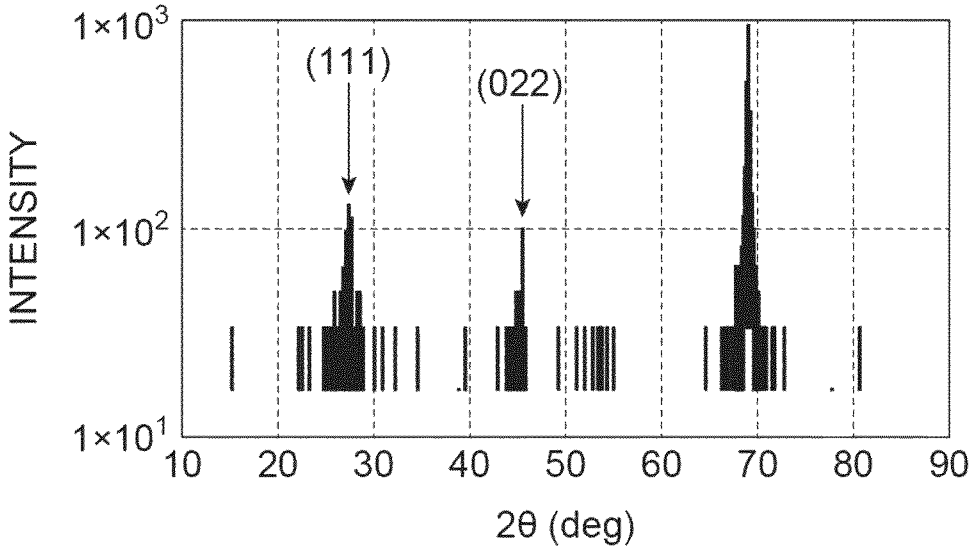
Figure 6A:
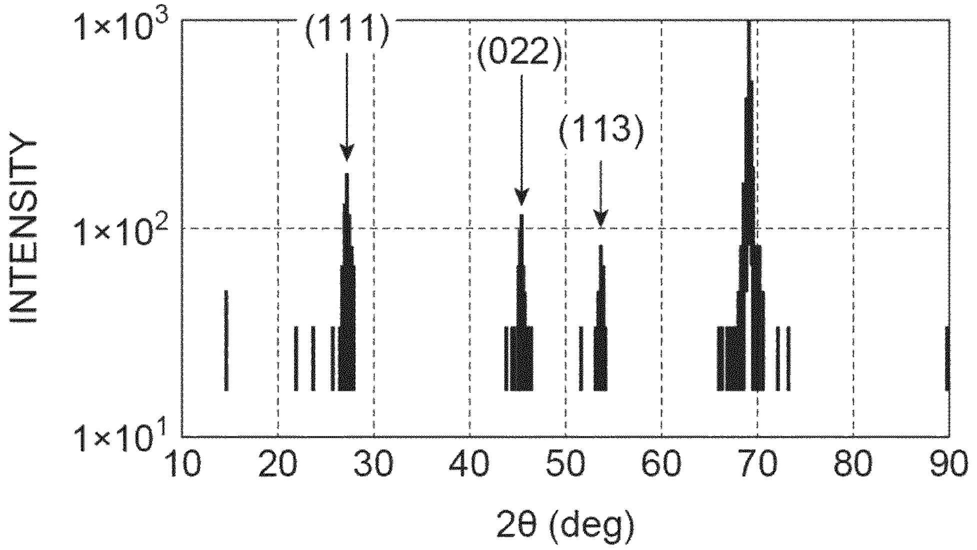
FIGS. 6A, and 6B are another diagram showing evaluation results of crystallinity by X-ray diffraction.
Figure 6B:
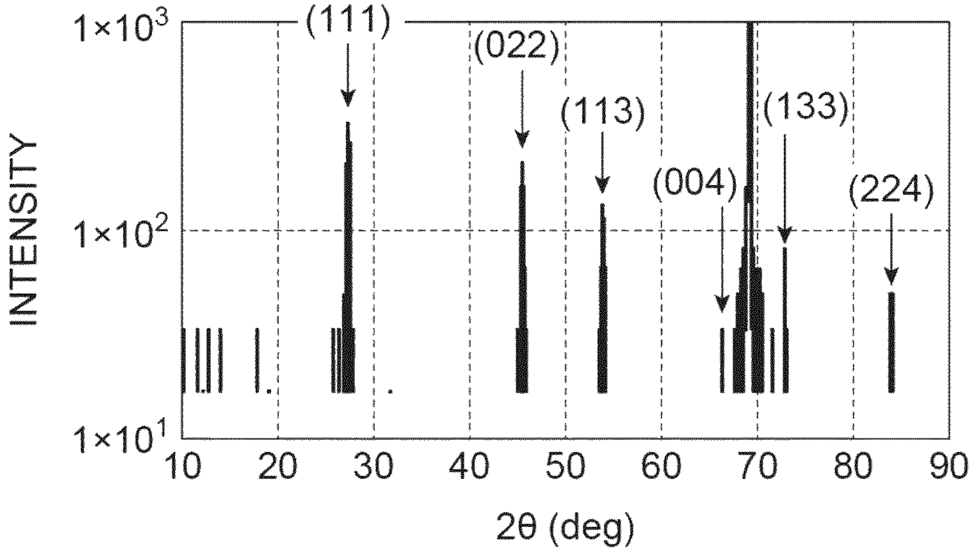

As shown in FIG. 5A, regarding the target heated "at 400° C. for five hours", a diffraction peak indicating crystallinity of germanium did not appear. As shown in FIGS. 5B, 6A, and 6B, regarding the target heated "at 500° C. for five hours", the target heated "at 600° C. for five hours", and the target heated "at 700° C. for five hours", a plurality of diffraction peaks indicating crystallinity of germanium appeared, and the number and the intensity of diffraction peaks indicating crystallinity of germanium increased as the temperature rose. From this, it is ascertained that heating at a temperature of 500° C. or higher is preferable for polycrystallization of germanium. However, for example, if the heating time is lengthened, polycrystallization of germanium can be realized even by heating at a temperature lower than 500° C. As shown in FIG. 6B, even in the target heated "at 700° C. for five hours", since the diffraction peak (66.0°) of (004) along a plane orientation (001) of silicon has not appeared, it is ascertained that polycrystallization of germanium has proceeded regardless of the crystal orientation of the silicon wafer (support substrate).

Figure 7A:
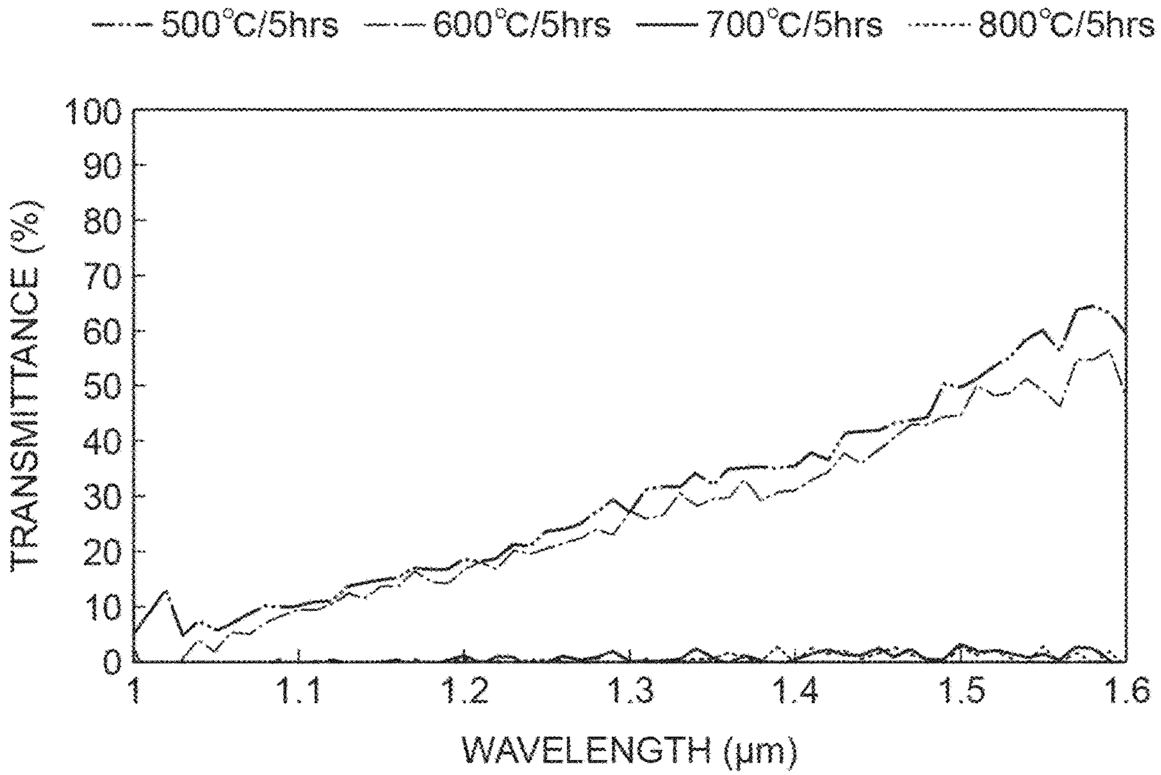
FIGS. 7A, and 7B are a view showing evaluation results of a transmittance.
Figure 7B:
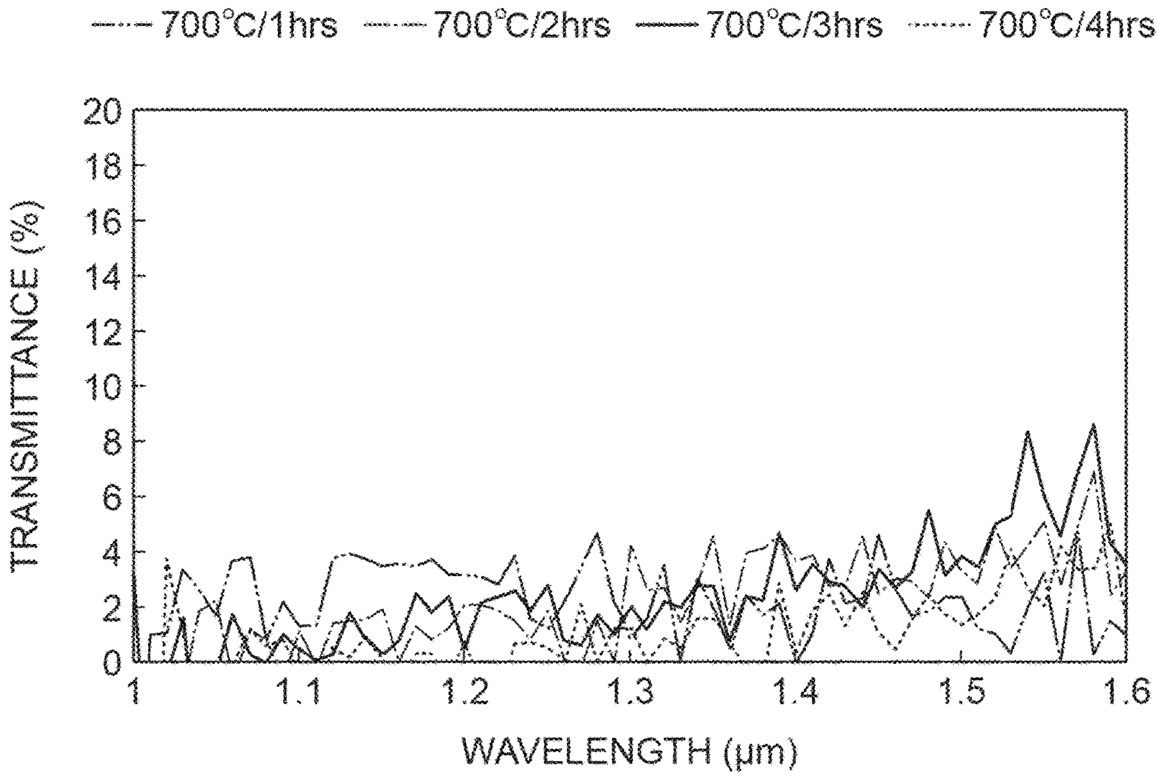

FIGS. 7A and 7B are views showing evaluation results of a transmittance. Similar to the evaluation results shown in FIGS. 5A to 6B described above, evaluation targets in FIGS. 7A and 7B were obtained by forming a film of germanium on a silicon wafer of normal specification under the foregoing predetermined conditions and performing heating under different conditions. As shown in FIG. 7A, in targets heated at 700° C. and 800° C., compared to those heated at 500° C. and 600° C., the transmittance with respect to light of a short-wave infrared region has significantly deteriorated. From this, it is ascertained that heating at a temperature of 700° C. or higher is preferable for securing high absorbability with respect to light of a short-wave infrared region. In addition, as shown in FIG. 7B, when heating is performed at 700° C., the transmittance with respect to light of a short-wave infrared region is sufficiently low in all those heated for one hour or longer. From this, it is ascertained that heating needs to be performed for at least one hour.

As described above, in the photodetection element 1A, the P-type germanium-containing layer 3 forming a hetero PN junction between the P-type germanium-containing layer 3 and the N-type silicon layer 2 formed in a single crystal state is formed in a polycrystal state. Accordingly, the germanium-containing layer 3 can be formed over a large area. In addition, peeling or the like of the germanium-containing layer 3 formed over a large area can be curbed. Thus, according to the photodetection element 1A, an area of a light receiving region can be increased while a hetero PN junction is utilized.

In the photodetection element 1A, the thickness of the germanium-containing layer 3 is 1 μm or larger. Accordingly, high absorbability can be secured with respect to the light hv of a short-wave infrared region. Since an absorption coefficient α (α is derived out from $I(x)=I_0\exp(-\alpha x)$") of germanium with respect to light having a wavelength of 1.0 to 1.6 μm is approximately $10^6$ $m^{-1}$ and an intensity is 1/e (=0.37) at a depth of 1 μm (a reciprocal of α), it is preferable that the thickness of the germanium-containing layer 3 is 1 μm or larger. In addition, if the thickness of the germanium-containing layer 3 exceeds 2 μm, peeling or the like of the germanium-containing layer 3 is likely to occur, or the layer 30 including germanium in its entirety is unlikely to be polycrystallized at the time of manufacturing the photodetection element 1A. Therefore, it is preferable that the thickness of the germanium-containing layer 3 is 2 μm or smaller.

In the photodetection element 1A, the germanium-containing layer 3 is disposed on the first surface 2*a* of the silicon layer 2, the first electrode 4 is disposed on a region of the first surface 2*a* of the silicon layer 2 where the germanium-containing layer 3 is not disposed, and the second electrode 5 is disposed on the surface 3*a* of the germanium-containing layer 3 on a side opposite to the silicon layer 2. Accordingly, since the first electrode 4 is formed on the single-crystal silicon layer 2, noise superimposed on a drawn out current signal can be curbed.

It is also conceivable to adopt a constitution in which a PN junction is formed inside the germanium-containing layer 3 by forming an N-type impurity region inside the P-type germanium-containing layer 3. However, in such a case, since there is a need to provide both the first electrode 4 and the second electrode 5 on the polycrystal germanium-containing layer 3, there is concern that noise superimposed on a drawn out current signal may increase. In contrast, in the photodetection element 1A in which a hetero PN junction is formed between the N-type silicon layer 2 and the P-type germanium-containing layer 3, since there is no need to provide both the first electrode 4 and the second electrode 5 on the polycrystal germanium-containing layer 3, the photodetection element 1A is advantageous in that noise superimposed on a drawn out current signal can be curbed.

In the photodetection element 1A, the first electrode 4 extends along the outer edge of the germanium-containing layer 3. Accordingly, a current signal can be efficiently drawn out from the depletion layer D formed in the boundary region between the silicon layer 2 and the germanium-containing layer 3.

In the photodetection element 1A, the second electrode 5 extends along the outer edge of the germanium-containing layer 3, and the antireflection film 6 is formed on the region of the surface 3*a* of the germanium-containing layer 3 on the inward side of the second electrode 5. Accordingly, the light hv (detection target) can be efficiently incident from the surface 3*a* of the germanium-containing layer 3 on a side opposite to the silicon layer 2. Moreover, in such a case, a current signal can be efficiently drawn out from the depletion layer D formed in the boundary region between the silicon layer 2 and the germanium-containing layer 3.

The method for manufacturing the photodetection element 1A includes the first step of performing film formation of the layer 30 including germanium on the silicon layer 2, and the second step of polycrystallizing the layer 30 including germanium and forming the germanium-containing layer 3 by heating the layer 30 including germanium after the first step. Accordingly, the germanium-containing layer 3 can be formed over a large area.

In the method for manufacturing the photodetection element 1A, in the second step, the layer 30 including germanium is heated at a temperature of 500° C. or higher for one hour or longer. Accordingly, the layer 30 including germanium can be reliably polycrystallized.

In the method for manufacturing the photodetection element 1A, in the second step, the layer 30 including germanium is heated at a temperature of 700° C. or higher. Accordingly, the layer 30 including germanium can be more reliably polycrystallized, and the germanium-containing layer 3 having high absorbability with respect to the light hv of a short-wave infrared region can be obtained.

In the method for manufacturing the photodetection element 1A, in the second step, the layer 30 including germanium is heated for one hour or longer. Accordingly, the germanium-containing layer 3 having high absorbability with respect to the light hv of a short-wave infrared region can be obtained.

Second Embodiment

Figure 8:
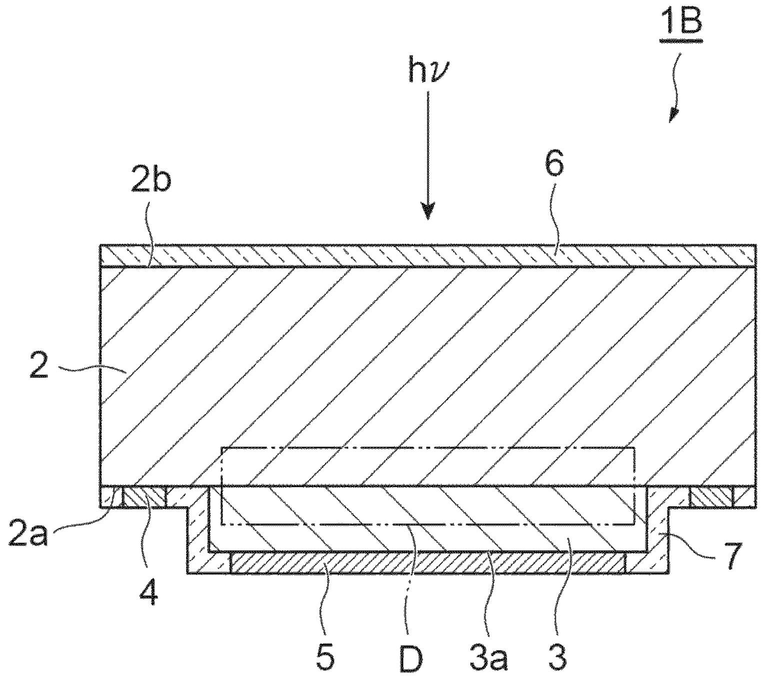
FIG. 8 is a cross-sectional view of a photodetection element of a second embodiment.
Figure 9:
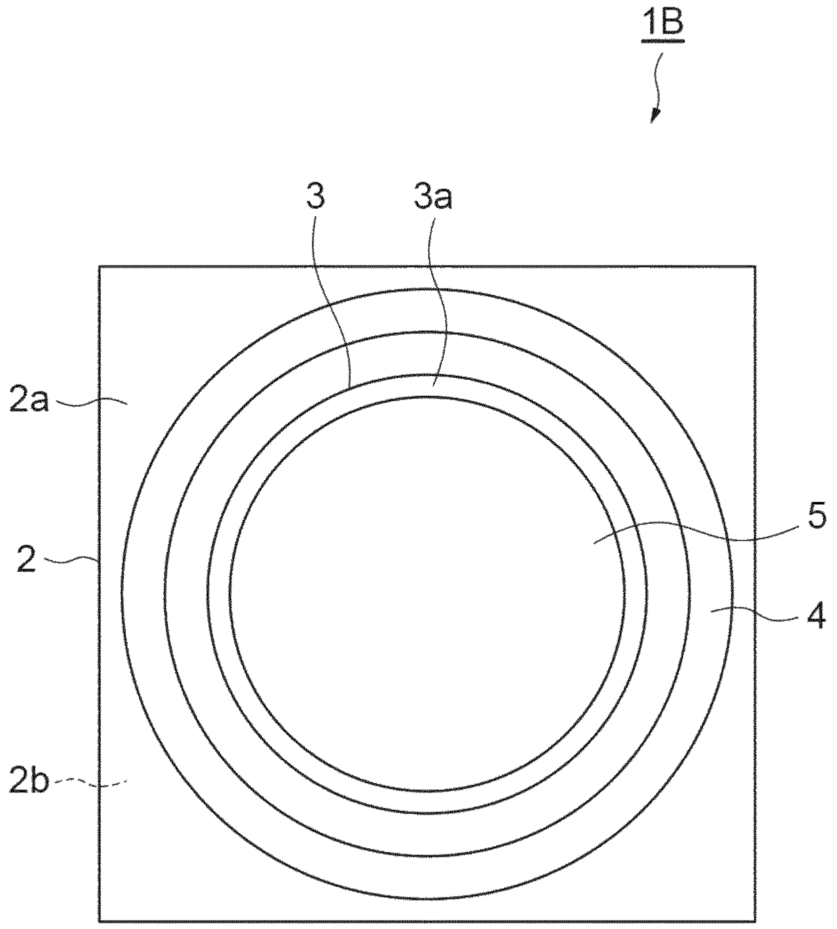
FIG. 9 is a bottom view of the photodetection element illustrated in FIG. 8.

FIG. 8 is a cross-sectional view of a photodetection element 1B of a second embodiment, and FIG. 9 is a bottom view of the photodetection element 1B illustrated in FIG. 8. As illustrated in FIGS. 8 and 9, the photodetection element 1B includes the silicon layer 2, the germanium-containing layer 3, the first electrode 4, the second electrode 5, the antireflection film 6, and a protective film 7. In FIG. 9, illustration of the protective film 7 is omitted.

In the photodetection element 1B, the constitutions of the silicon layer 2, the germanium-containing layer 3, and the first electrode 4 are the same as those of the photodetection element 1A described above. In the photodetection element 1B, the second electrode 5 is formed substantially on the entire surface 3*a* of the germanium-containing layer 3, and the antireflection film 6 is formed on the second surface 2*b* of the silicon layer 2. The protective film 7 is formed on the region of the surface 3*a* of the germanium-containing layer 3 on the outward side of the second electrode 5, the side surface of the germanium-containing layer 3, the region of the first surface 2*a* of the silicon layer 2 between the germanium-containing layer 3 and the first electrode 4, and the region of the first surface 2*a* of the silicon layer 2 on the outward side of the first electrode 4. The protective film 7 is formed of silicon oxide or silicon nitride, for example. In the photodetection element 1B, since the first electrode 4 and the second electrode 5 are disposed on a side opposite to an incident side of the light hv (detection target), the first electrode 4 and the second electrode 5 can be connected to an integrated circuit or the like using a bump or the like.

In the photodetection element 1B constituted as described above, when the light hv (detection target) is incident on the silicon layer 2 through the antireflection film 6 formed on the second surface 2*b* of the silicon layer 2, the light hv is transmitted through the silicon layer 2 and is absorbed in the germanium-containing layer 3, and photoelectric conversion occurs in the germanium-containing layer 3. Carriers generated due to this are drawn out from the depletion layer D as current signals through the first electrode 4 and the second electrode 5. The light hv (detection target) is light of a short-wave infrared region.

Similar to the method for manufacturing the photodetection element 1A described above, a method for manufacturing the photodetection element 1B includes the first step of performing film formation of the layer 30 including germanium on the silicon layer 2, and the second step of polycrystallizing the layer 30 including germanium and forming the germanium-containing layer 3 by heating the silicon layer 2 after the first step.

As described above, in the photodetection element 1B, the P-type germanium-containing layer 3 forming a hetero PN junction between the P-type germanium-containing layer 3 and the N-type silicon layer 2 formed in a single crystal state is formed in a polycrystal state. Accordingly, the germanium-containing layer 3 can be formed over a large area. In addition, peeling or the like of the germanium-containing layer 3 formed over a large area can be curbed. Thus, according to the photodetection element 1B, an area of a light receiving region can be increased while a hetero PN junction is utilized.

In the photodetection element 1B, the thickness of the germanium-containing layer 3 is 1 μm or larger. Accordingly, high absorbability can be secured with respect to the light hv of a short-wave infrared region.

In the photodetection element 1B, the germanium-containing layer 3 is disposed on the first surface 2*a* of the silicon layer 2, the first electrode 4 is disposed on a region of the first surface 2*a* of the silicon layer 2 where the germanium-containing layer 3 is not disposed, and the second electrode 5 is disposed on the surface 3*a* of the germanium-containing layer 3 on a side opposite to the silicon layer 2. Accordingly, since the first electrode 4 is formed on the single-crystal silicon layer 2, noise superimposed on a drawn out current signal can be curbed.

In the photodetection element 1B, the first electrode 4 extends along the outer edge of the germanium-containing layer 3. Accordingly, a current signal can be efficiently drawn out from the depletion layer D formed in the boundary region between the silicon layer 2 and the germanium-containing layer 3.

In the photodetection element 1B, the antireflection film 6 is formed on the second surface 2*b* of the silicon layer 2. Accordingly, the light hv (detection target) can be efficiently incident from the second surface 2*b* of the silicon layer 2 on a side opposite to the germanium-containing layer 3. Moreover, in such a case, a current signal can be efficiently drawn out from the depletion layer D formed in the boundary region between the silicon layer 2 and the germanium-containing layer 3.

In a constitution in which a PN junction is formed inside the germanium-containing layer 3 by forming an N-type impurity region inside the P-type germanium-containing layer 3, there is concern that a part of the light hv may be absorbed in the germanium-containing layer 3 before the light hv arrives at the depletion layer inside the germanium-containing layer 3. In contrast, in the photodetection element 1B, since the light hv which has been transmitted through the silicon layer 2 and has arrived at the germanium-containing layer 3 is absorbed in the depletion layer D of the germanium-containing layer 3 (namely, the light hv is transmitted through the silicon layer 2 and directly arrives at a region having the highest electric field intensity in the depletion layer D of the germanium-containing layer 3), the photodetection element 1B is advantageous in that carriers generated due to photoelectric conversion can be reliably captured.

The method for manufacturing the photodetection element 1B includes the first step of performing film formation of the layer 30 including germanium on the silicon layer 2, and the second step of polycrystallizing the layer 30 including germanium and forming the germanium-containing layer 3 by heating the layer 30 including germanium after the first step. Accordingly, the germanium-containing layer 3 can be formed over a large area.

In the method for manufacturing the photodetection element 1B, in the second step, the layer 30 including germanium is heated at a temperature of 500° C. or higher for one hour or longer. Accordingly, the layer 30 including germanium can be reliably polycrystallized.

In the method for manufacturing the photodetection element 1B, in the second step, the layer 30 including germanium is heated at a temperature of 700° C. or higher. Accordingly, the layer 30 including germanium can be more reliably polycrystallized, and the germanium-containing layer 3 having high absorbability with respect to the light hv of a short-wave infrared region can be obtained.

In the method for manufacturing the photodetection element 1B, in the second step, the layer 30 including germanium is heated for one hour or longer. Accordingly, the germanium-containing layer 3 having high absorbability with respect to the light hv of a short-wave infrared region can be obtained.

Modification Example

The present disclosure is not limited to the foregoing embodiments. For example, the shapes, the positions, and the like of the first electrode 4 and the second electrode 5 are not limited to those described above. The first electrode 4 need only be electrically connected to the silicon layer 2, and the second electrode 5 need only be electrically connected to the germanium-containing layer 3. In addition, the thickness of the germanium-containing layer 3 may be smaller than 1 μm or may be 2 μm or larger. In addition, the antireflection film 6 may not be formed on both the second surface 2*b* of the silicon layer 2 and the surface 3*a* of the germanium-containing layer 3 or may be formed on both the second surface 2*b* of the silicon layer 2 and the surface 3*a* of the germanium-containing layer 3. In addition, each of the photodetection elements 1A and 1B is not limited to that including one light receiving portion constituted of the germanium-containing layer 3, and it may include a plurality of light receiving portions constituted of the germanium-containing layer 3. In addition, the silicon layer 2 is not limited to a single-crystal silicon substrate as long as it is an N-type silicon layer formed in a single crystal state, and for example, it may be an epitaxial growth layer formed on a silicon substrate.

The photodetection element according to the aspect of the present disclosure is [1] "a photodetection element including an N-type silicon layer formed in a single crystal state, a P-type germanium-containing layer formed in a polycrystal state and forming a hetero PN junction between the germanium-containing layer and the silicon layer, a first electrode electrically connected to the silicon layer, and a second electrode electrically connected to the germanium-containing layer".

In the photodetection element according to the foregoing [1], the P-type germanium-containing layer forming a hetero PN junction between the P-type germanium-containing layer and the N-type silicon layer formed in a single crystal state is formed in a polycrystal state. Accordingly, the germanium-containing layer can be formed over a large area. In addition, peeling or the like of the germanium-containing layer formed over a large area can be curbed. Thus, according to the photodetection element disclosed in the foregoing [1], an area of a light receiving region can be increased while a hetero PN junction is utilized.

The photodetection element according to the aspect of the present disclosure may be [2] "the photodetection element according to the foregoing [1] in which a thickness of the germanium-containing layer is 1 μm or larger". According to the photodetection element disclosed in this [2], high absorbability can be secured with respect to light of a short-wave infrared region.

The photodetection element according to the aspect of the present disclosure may be [3] "the photodetection element according to the foregoing [1] or [2] in which the silicon layer has a first surface and a second surface on a side opposite to the first surface, the germanium-containing layer is disposed on the first surface, the first electrode is disposed on a region of the first surface where the germanium-containing layer is not disposed, and the second electrode is disposed on a surface of the germanium-containing layer on a side opposite to the silicon layer". According to the photodetection element disclosed in this [3], since the first electrode is formed on a single-crystal silicon layer, noise superimposed on a drawn out current signal can be curbed.

The photodetection element according to the aspect of the present disclosure may be [4] "the photodetection element according to the foregoing [3] in which the first electrode extends along an outer edge of the germanium-containing layer". According to the photodetection element disclosed in this [4], a current signal can be efficiently drawn out from the depletion layer formed in the boundary region between the silicon layer and the germanium-containing layer.

The photodetection element according to the aspect of the present disclosure may be [5] "the photodetection element according to the foregoing [3] or [4] in which the second electrode extends along an outer edge of the germanium-containing layer, and an antireflection film is formed on a region of the surface of the germanium-containing layer on an inward side of the second electrode". According to the photodetection element disclosed in this [5], light (detection target) can be efficiently incident from the surface of the germanium-containing layer on a side opposite to the silicon layer. Moreover, in such a case, a current signal can be efficiently drawn out from the depletion layer formed in the boundary region between the silicon layer and the germanium-containing layer.

The photodetection element according to the aspect of the present disclosure may be [6] "the photodetection element according to the foregoing [3] or [4] in which an antireflection film is formed on the second surface". According to the photodetection element disclosed in this [6], light (detection target) can be efficiently incident from the second surface of the silicon layer on a side opposite to the germanium-containing layer. Moreover, in such a case, a current signal can be efficiently drawn out from the depletion layer formed in the boundary region between the silicon layer and the germanium-containing layer.

The method for manufacturing a photodetection element according to the aspect of the present disclosure is [7] "a method for manufacturing a photodetection element according to any one of the foregoing [1] to [6], the method for manufacturing a photodetection element including a first step of performing film formation of a layer including germanium on the silicon layer, and a second step of polycrystallizing the layer including germanium and forming the germanium-containing layer by heating the layer including germanium after the first step".

According to the method for manufacturing a photodetection element disclosed in the foregoing [7], the germanium-containing layer can be formed over a large area.

The method for manufacturing a photodetection element according to the aspect of the present disclosure may be [8] "the method for manufacturing a photodetection element according to the foregoing [7] in which in the second step, the layer including germanium is heated at a temperature of 500° C. or higher for one hour or longer". According to the method for manufacturing a photodetection element disclosed in this [8], the layer including germanium can be reliably polycrystallized.

The method for manufacturing a photodetection element according to the aspect of the present disclosure may be [9] "the method for manufacturing a photodetection element according to the foregoing [8] in which in the second step, the layer including germanium is heated at a temperature of 700° C. or higher". According to the method for manufacturing a photodetection element disclosed in this [9], the layer including germanium can be more reliably polycrystallized, and the germanium-containing layer having high absorbability with respect to light of a short-wave infrared region can be obtained.

The method for manufacturing a photodetection element according to the aspect of the present disclosure may be "the method for manufacturing a photodetection element according to the foregoing [8] or [9] in which in the second step, the layer including germanium is heated for one hour or longer". According to the method for manufacturing a photodetection element disclosed in this [10], the layer including germanium can be polycrystallized, and the germanium-containing layer having high absorbability with respect to light of a short-wave infrared region can be obtained.

According to the present disclosure, it is possible to provide a photodetection element in which an area of a light receiving region can be increased while a hetero PN junction is utilized, and a method for manufacturing a photodetection element.

What is claimed is:

1. A method for manufacturing a photodetection element, the method comprising:

a step of providing an N-type silicon layer formed in a single crystal state;

a first step of performing film formation of a layer including germanium on the N-type silicon layer;

a second step of polycrystallizing the layer including germanium and forming a P-type germanium-containing layer formed in a polycrystal state and forming a hetero PN junction between the P-type germanium-containing layer and the N-type silicon layer by heating the layer including germanium after the first step; and a step of forming a first electrode electrically connected to the N-type silicon layer and a second electrode electrically connected to the P-type germanium-containing layer.

2. The method for manufacturing a photodetection element according to claim 1, wherein in the second step, the layer including germanium is heated at a temperature of 500° C. or higher for one hour or longer.

3. The method for manufacturing a photodetection element according to claim 2, wherein in the second step, the layer including germanium is heated at a temperature of 700° C. or higher.

4. The method for manufacturing a photodetection element according to claim 2, wherein in the second step, the layer including germanium is heated for one hour or longer.

* * * * *